(12) United States Patent
Yamagishi et al.

(10) Patent No.: US 12,065,356 B2
(45) Date of Patent: *Aug. 20, 2024

(54) CARBON FILM

(71) Applicant: ZEON CORPORATION, Tokyo (JP)

(72) Inventors: Tomoko Yamagishi, Tokyo (JP); Mitsugu Uejima, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 186 days.

This patent is subject to a terminal disclaimer.

(21) Appl. No.: 17/904,290

(22) PCT Filed: Feb. 17, 2021

(86) PCT No.: PCT/JP2021/005996
§ 371 (c)(1),
(2) Date: Aug. 16, 2022

(87) PCT Pub. No.: WO2021/172141
PCT Pub. Date: Sep. 2, 2021

(65) Prior Publication Data
US 2023/0080840 A1 Mar. 16, 2023

(30) Foreign Application Priority Data
Feb. 28, 2020 (JP) .................. 2020-034308

(51) Int. Cl.
C01B 32/162 (2017.01)
H05K 9/00 (2006.01)

(52) U.S. Cl.
CPC .......... *C01B 32/162* (2017.08); *H05K 9/009* (2013.01); *C01B 2202/08* (2013.01); *C01P 2002/82* (2013.01); *C01P 2004/03* (2013.01); *C01P 2006/16* (2013.01)

(58) Field of Classification Search
CPC .......... C01B 2202/08; C01B 2202/30; C01B 2202/32; C01B 2202/34; C01B 2202/36; C01B 32/162; C01B 32/164; C01B 32/168; C01B 32/16; C01P 2002/82; C01P 2004/03; C01P 2006/11; C01P 2006/16; C01P 2006/17; H05K 9/009; H05K 9/00
See application file for complete search history.

(56) References Cited

FOREIGN PATENT DOCUMENTS

JP 2018145027 A 9/2018

OTHER PUBLICATIONS

Feng et al. CN 101239712 (Year: 2010).*
(Continued)

*Primary Examiner* — Lawrence D Ferguson
(74) *Attorney, Agent, or Firm* — KENJA IP LAW PC

(57) ABSTRACT

The present disclosure is directed to providing a carbon film having an excellent shield performance against electromagnetic waves. The carbon film of the present disclosure is a carbon film made of a carbon nanotube assembly, wherein a pore distribution curve of the carbon film indicating the relationship between the pore size and the Log differential pore capacity obtained from an adsorption isotherm at 77 K of liquid nitrogen based on the Barrett-Joyner-Halenda method has a peak in which the Log differential pore capacity is maximized within a pore size range of 10 nm or more and 100 nm or less, and the value of the Log differential pore capacity at the peak is 1.2 cm³/g or more.

4 Claims, 7 Drawing Sheets

(56) References Cited

OTHER PUBLICATIONS

Mar. 1, 2024, the Extended European Search Report issued by the European Patent Office in the corresponding European Patent Application No. 21760456.0.
Aug. 30, 2022, International Preliminary Report on Patentability issued in the International Patent Application No. PCT/JP2021/005996.

* cited by examiner

SEM image

Two-dimensional spatial frequency spectrum

CARBON FILM

TECHNICAL FIELD

The present disclosure relates to a carbon film.

BACKGROUND

In recent years, carbon nanotubes (hereinafter, also referred to as "CNTs") have been attracting attention as materials having excellent electrical conductivity, thermal conductivity, and mechanical characteristics. However, CNTs are fine structures having nanometer-size diameters, which makes handling and processing of individual CNTs difficult. Therefore, for providing good handleability and workability for usage in various applications, conventionally, an assembly composed of a plurality of CNTs (hereinafter referred to as "carbon nanotube assembly") is formed into a film to thereby produce a carbon film (see, for example, PTL 1).

PTL 1 discloses formation of a carbon film having an excellent mechanical strength using a carbon nanotube assembly in which pores having bore sizes as measured by the mercury intrusion porosimetry of 400 nm or more and 1500 nm or less have a region of 10 nm or more where the Log differential pore capacity is 0.006 $cm^3/g$ or less.

CITATION LIST

Patent Literature

PTL 1: JP 2018-145027 A

SUMMARY

Technical Problem

In recent years, sheets (electromagnetic wave shield sheets) capable of absorption and/or reflection electromagnetic waves to shield the electromagnetic waves have attracted attention as an application of carbon films.

The above-mentioned conventional carbon films, however, when used as electromagnetic wave shield sheets, fail to provide a sufficient performance to shield electromagnetic waves (shield performance).

It would be, therefore, helpful to provide a carbon film having an excellent shield performance against electromagnetic waves.

Solution to Problem

The present inventors have made extensive studies in order to achieve the foregoing object. The present inventors have conducted studies on minute properties of a carbon film formed from a carbon nanotube assembly, and attained new finding that a carbon film of which pore distribution curve indicating the relationship between the pore size and the Log differential pore capacity has a certain shape can satisfactorily shield electromagnetic waves, thereby completing the present disclosure.

That is, the present disclosure is directed to advantageously solving the above-mentioned problem, and the carbon film of the present disclosure is a carbon film formed from a carbon nanotube assembly, wherein a pore distribution curve of the carbon film indicating a relationship between a pore size and a Log differential pore capacity obtained from an adsorption isotherm at 77 K of liquid nitrogen based on the Barrett-Joyner-Halenda method has a peak in which the Log differential pore capacity is maximized within a pore size range of 10 nm or more and 100 nm or less, and a value of the Log differential pore capacity at the peak is 1.2 $cm^3/g$ or more. A carbon film having a highest peak satisfying the above-mentioned condition in the pore distribution curve obtained from the adsorptive isotherm at 77 K of liquid nitrogen based on the Barrett-Joyner-Halenda method (hereinafter, sometimes abbreviated as "BJH method") has an excellent shield performance.

Herein, the carbon film of the present disclosure is preferably a free-standing film. The carbon film which is a free-standing film is excellent in handleability, and for example, when the carbon film is used as an electromagnetic wave shield sheet, the degree of freedom of how the sheet is disposed can be increased.

Note that, in the present disclosure, a "free-standing film" refers to a film which can maintain the shape of the film by itself in the absence of any support without being destroyed.

Preferably, the carbon film of the present disclosure has a thickness of 5 μm or more and 150 μm or less. When the thickness is within the above-mentioned range, the shield performance of the carbon film can be further improved while reduction in the weight and improvement in the mechanical strength of the carbon film are sufficiently achieved.

The carbon film of the present disclosure can be advantageously used, for example, as an electromagnetic wave shield sheet.

Advantageous Effect

According to the present disclosure, a carbon film having an excellent shield performance against electromagnetic waves can be provided.

DETAILED DESCRIPTION

An embodiment of the present disclosure will be described below.

A carbon film of the present disclosure is composed of an assembly of a plurality of carbon nanotubes (an carbon nanotube assembly). Note that the carbon film of the present disclosure may contain non-CNT components which can be unavoidably mixed during production processes of the CNT assembly and the carbon film, for example. The percentage of CNTs in the carbon film is preferably 95 mass % or more, more preferably 98 mass % or more, even more preferably 99 mass % or more, particularly preferably 99.5 mass % or more, and most preferably 100 mass % (i.e., the carbon film is consisting only of CNTs).

Herein, in the carbon film of the present disclosure, a pore distribution curve indicating the relationship between the pore size and the Log differential pore capacity obtained from an adsorption isotherm at 77 K of liquid nitrogen based on the BJH method has a peak in which the Log differential pore capacity is maximized (highest peak) within a pore size range of 10 nm or more and 100 nm or less, and the value of the Log differential pore capacity at the highest peak is 1.2 $cm^3/g$ or more.

The carbon film of the present disclosure of which pore distribution curve has the above-mentioned certain shape has an excellent shield performance. Accordingly, the carbon film of the present disclosure can be advantageously used as, but are not particularly limited to, an electromagnetic wave shield sheet, for example.

(Pore Distribution Curve)

The pore distribution curve can be generated from an adsorptive isotherm at 77 K of liquid nitrogen based on the Barrett-Joyner-Halenda (BJH) method. Note that the BJH method is a measurement method in which the distribution of pores (pore sizes) is determined on the assumption that pores have cylindrical shapes. Still more particularly, in the present disclosure, the pore distribution curve can be generated using the method described in Examples.

Figure 1:
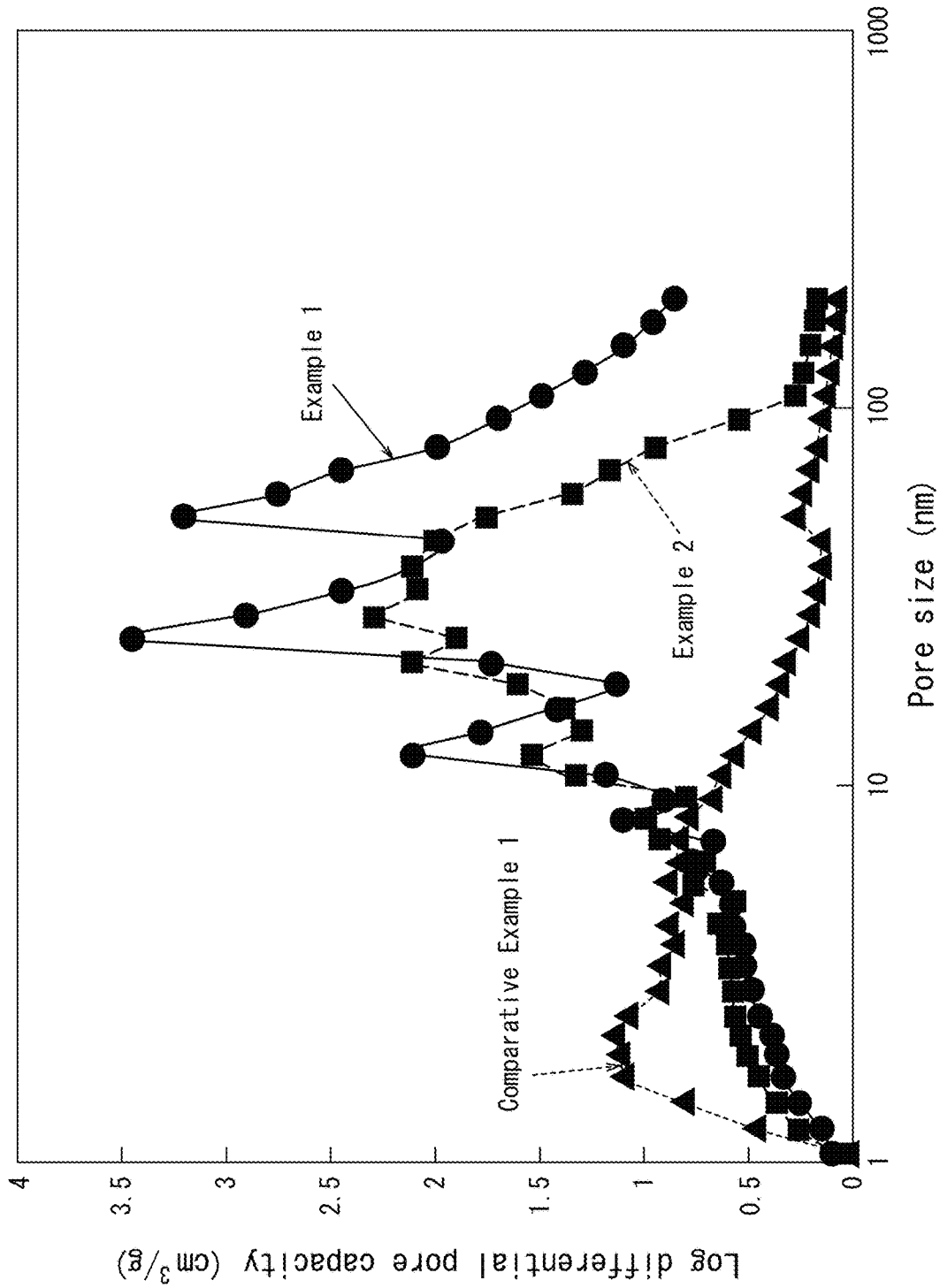
FIG. 1 depicts one example of a pore distribution curve of a carbon film.

Here, FIG. 1 depicts one example of a pore distribution curve of the carbon film of the present disclosure. In FIG. 1, a pore distribution curve in the pore size range of 1 nm or more and 200 nm or less is plotted, in which the horizontal axis represents the logarithm of the pore size (unit: nm) (Log pore size) and the vertical axis represents the Log pore differential volume (dVp/d log dp, unit: $cm^3/g$).

Examples 1 and 2 correspond to carbon films of the present disclosure. Herein, the pore distribution curves of carbon films of Examples 1 and 2 each have a peak in which the Log differential pore capacity is maximized (highest peak) within the pore size range of 10 nm or more and 100 nm or less, and the value of the Log differential pore capacity at the highest peak is 1.2 $cm^3/g$ or more. More specifically, the pore distribution curve of Example 1 has a highest peak at a pore size of 24 nm where the Log differential pore capacity is 3.5 $cm^3/g$, and the pore distribution curve of Example 2 has a highest peak at a pore size of 28 nm where the Log differential pore capacity is 2.3 $cm^3/g$.

Note that from the viewpoint of further improving the shield performance of the carbon film, the pore distribution curve preferably has a highest peak in a pore size range of 12 nm or more and 95 nm or less, more preferably has a highest peak in the pore size range of 15 nm or more and 90 nm or less, and even more preferably has a highest peak in the pore size range of 18 nm or more and 85 nm or less.

In addition, from the viewpoint of further improving the shield performance of the carbon film, on the pore distribution curve, the Log differential pore capacity at the highest peak is 1.3 $cm^3/g$ or more, more preferably 1.4 $cm^3/g$ or more, even more preferably 1.5 $cm^3/g$ or more, and particularly preferably 2.3 $cm^3/g$ or more.

The upper limit of the Log differential pore capacity at the highest peak on the pore distribution curve is not particularly limited, but may be, for example, 20.0 $cm^3/g$ or less, 15.0 $cm^3/g$ or less, or 7.0 $cm^3/g$ or less.

(Method of Producing Carbon Film)

Herein, the carbon film of the present disclosure which can have a pore distribution curve as described above can be produced by satisfying at least either of the following, upon forming the carbon nanotube assembly into a film to thereby produce the carbon film:

a CNT assembly that satisfies at least one of the conditions (1) to (3) to be described later is used as a CNT assembly; or before forming the CNT assembly into a film, dry pulverization is performed on the CNT assembly, <CNT Assembly>

Although a well-known CNT assembly such as a CNT assembly obtained using the super-growth method (see WO 2006/011655 A, sometimes referred to as "SGCNTs" in this specification), for example, may be used as the CNT assembly for preparing the carbon film, a novel CNT assembly satisfying at least one of the conditions (1) to (3) is preferably used. A CNT assembly satisfying at least one of the following conditions (1) to (3) has an excellent dispersibility:

(1) a spectrum obtained by a Fourier transform infrared spectroscopic analysis on a carbon nanotube dispersion obtained by dispersing the carbon nanotube assembly such that the bundle length is 10 μm or more, has at least one peak based on plasmon resonance of the carbon nanotube dispersion in a wavenumber range of more than 300 $cm^{-1}$ and 2000 $cm^{-1}$ or less;

(2) a pore distribution curve of the carbon nanotube assembly has a peak where the Log differential pore capacity is maximized within a pore size range of more than 100 nm and less than 400 nm; and (3) a two-dimensional spatial frequency spectrum of an electron microscopic image of the carbon nanotube assembly has at least one peak within a range of 1 $\mu m^{-1}$ or more and 100 $\mu m^{-1}$ or less.

Figure 2:
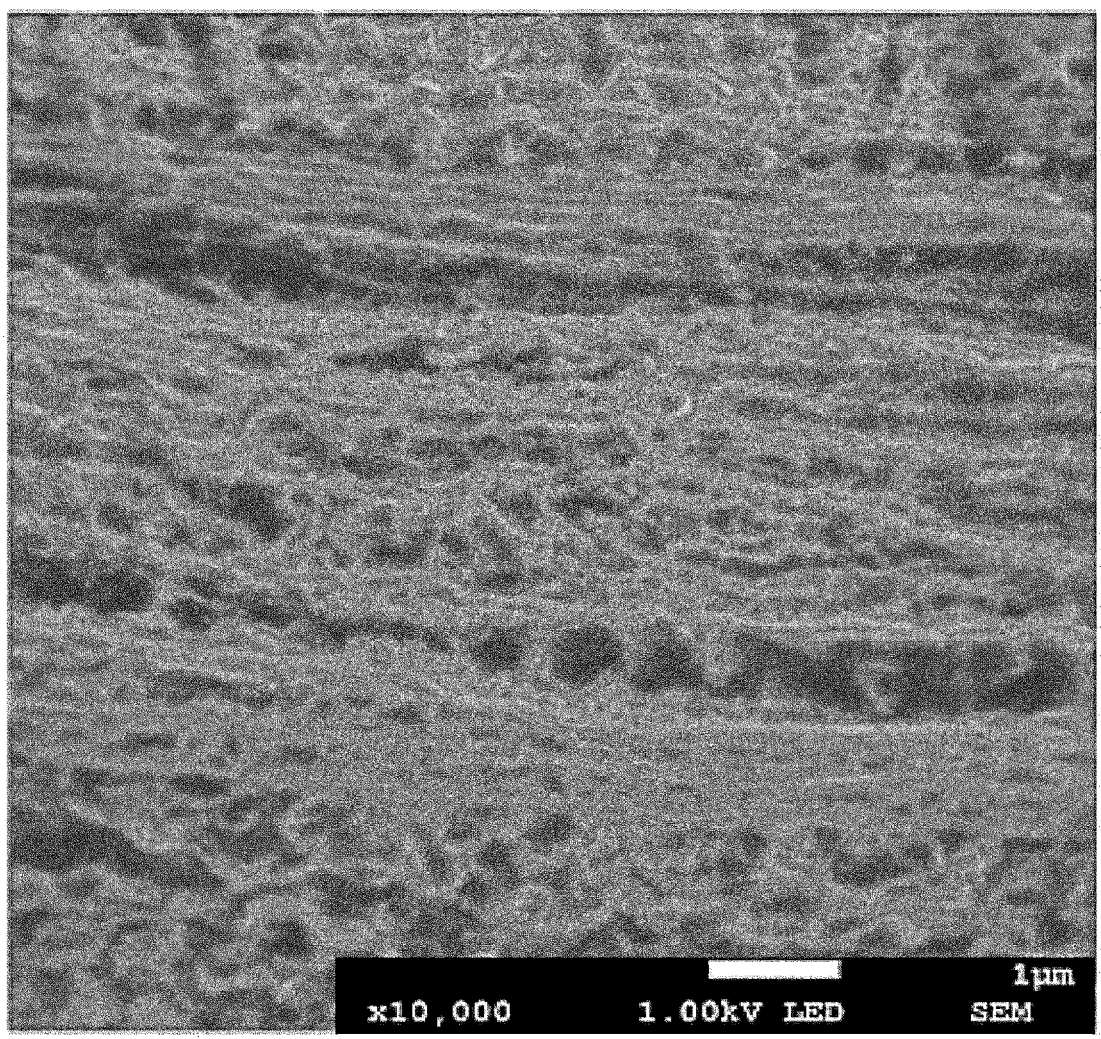
FIG. 2 depicts one example of a scanning electron microscope (SEM) image of a CNT assembly.

The reason why the CNT assembly satisfying at least one of the above-described conditions (1) to (3) has an excellent dispersibility has not been clarified yet, but is hypothesized as follows. FIG. 2 is a scanning electron microscopic (SEM) image of one example of a CNT assembly satisfying at least one of (1) to (3) above. As depicted in FIG. 2, the CNTs composing the CNT assembly satisfying any the above-described conditions (1) to (3) have wave-like structures. It is hypothesized that such "wave-like structures" help to reduce interactions among CNTs composing the CNT assembly. If interactions among CNTs are reduced, the CNTs included in the CNT assembly are prevented from tightly bundling and aggregating. As a result, the CNT assembly can be easily dispersed. Further, the high dispersibility of the CNT assembly may provide the effect of improving the secondary processability of the CNT assembly. For example, when a CNT assembly is formed into a film to thereby produce a carbon film, this effect may lead to an increased shield performance of the produced carbon film. Hereinafter, the above-described conditions (1) to (3) which can be satisfied by the CNT assembly of the present disclosure will be described in detail.

<<Condition (1)>>

The condition (1) specifies as follows: "a spectrum obtained by a Fourier transform infrared spectroscopic analysis on a carbon nanotube dispersion obtained by dispersing the carbon nanotube assembly such that the bundle length is 10 μm or more, has at least one peak based on plasmon resonance of the carbon nanotube dispersion in a wavenumber range of more than 300 cm$^{-1}$ and 2000 cm$^{-1}$ or less". Conventionally, a high absorptivity in the far infrared region is known as one of optical characteristics of CNTs. It is considered that this high absorptivity in the far infrared region is attributable to the diameters and lengths of the CNTs. The relationship between the absorptivity in the far-infrared region, more specifically, the plasmon resonance-based peak of CNTs, and the lengths of the CNTs is discussed in detail in non-patent literature (T. Morimoto et. al., "Length-Dependent Plasmon Resonance in Single-Walled Carbon Nanotubes," pp 9897-9904, Vol. 8, No. 10, ACS NANO, 2014). Based on the discussions described in the above non-patent literature and our own findings, the present inventors have built a hypothesis in that the position of a detected plasmon resonance-based peak of CNTs in a spectrum obtained by a Fourier transform infrared spectroscopic analysis may be somewhat affected by the distance between defect points in the CNTs, and have verified this hypothesis. The present inventors then have found that the position of a detected plasmon resonance-based peak of CNTs can serve as the index corresponding to the path between bending points in a CNT having a wave-like structure, and have established the above condition (1).

In the condition (1), if a plasmon resonance-based peak of CNTs is present in a wave number range of greater than 300 cm$^{-1}$ and 2000 cm$^{-1}$ or less, preferably in a wave number range of 500 cm$^{-1}$ or more and 2000 cm$^{-1}$ or less, more preferably in a wave number range of 700 cm$^{-1}$ or more and 2000 cm$^{-1}$ or less, the CNTs can have a good dispersibility.

Figure 3:
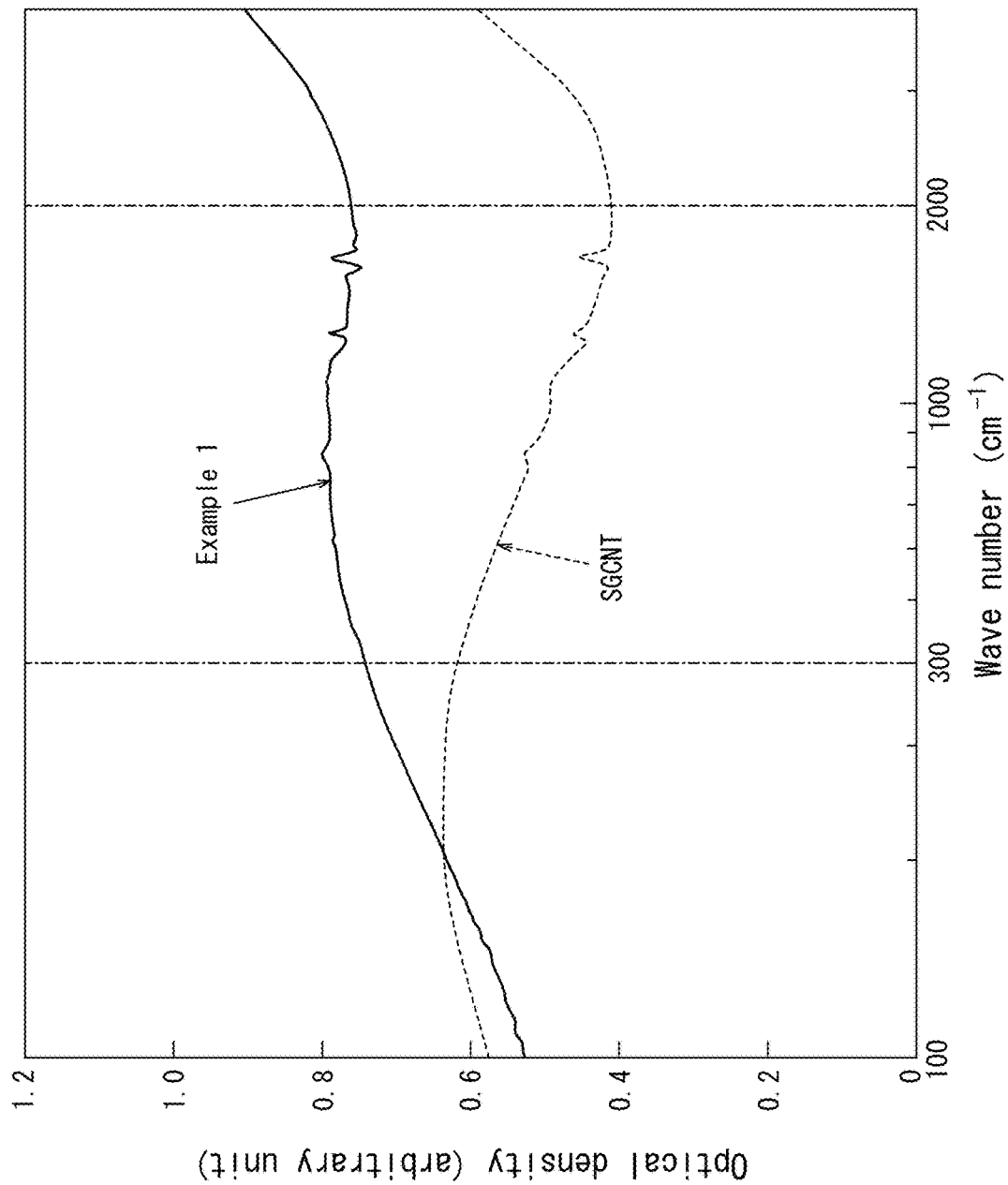
FIG. 3 depicts one example of a spectrum of the CNT assembly by a Fourier transform infrared spectroscopic analysis.

As depicted in FIG. 3, in a spectrum obtained by a Fourier transform infrared spectroscopic analysis, sharp peaks are observed in the vicinity of the wave number of 840 cm$^{-1}$, in the vicinity of 1300 cm$^{-1}$, and in the vicinity of 1700 cm$^{-1}$, other than the relatively gentle plasmon resonance-based peak of the CNT dispersion. These sharp peaks are not "plasmon resonance-based peaks of carbon nanotube dispersion", and each correspond to infrared absorption derived from functional groups. More specifically, the sharp peak in the vicinity of a wave number of 840 cm$^{-1}$ is attributable to out-of-plane bending vibration of C—H; the sharp peak in the vicinity of a wave number of 1300 cm$^{-1}$ is attributable to expansion and contraction vibration of epoxy three-membered rings; and the sharp peak in the vicinity of a wave number of 1700 cm$^{-1}$ is attributable to expansion and contraction vibration of C=O. As mentioned in the above non-patent literature by T. Morimoto et al., in the wave number range of more than 2000 cm$^{-1}$, a peak similar to the S1 peak is detected other than plasmon resonance-based peaks. Accordingly, the present inventors have established 2000$^{-1}$ cm or less as the upper limit for making a determination whether or not a plasmon resonance-based peak of the CNT dispersion is present in the condition (1).

Herein, in the condition (1), for obtaining a spectrum by a Fourier transform infrared spectroscopic analysis, a CNT dispersion needs to be obtained by dispersing the CNT assembly such that the bundle length is 10 µm or more. For example, a dispersion liquid where CNT dispersion having a bundle length of 10 µm or more is dispersed in water can be obtained by blending the CNT assembly, water, and a surfactant (e.g., sodium dodecylbenzenesulfonate) an appropriate ratio and agitating by means of ultrasonic waves or the like for a predetermined time duration.

The bundle length of the CNT dispersion can be determined by analyzing the dispersion with a particle size measurement apparatus in the wet image analysis type. Such a measurement apparatus calculates the area of each CNT dispersion from a captured image of the dispersion, and determines the diameter of a circle corresponding to the calculated area (hereinafter, sometimes also referred to as ISO area diameter). In this specification, the bundle length of each dispersion is defined as the value of the ISO area diameter obtained in this manner.

<<Condition (2)>>

The condition (2) specifies as follows: "a pore distribution curve measured on the carbon nanotube assembly has a peak where the Log differential pore capacity is maximized within a pore size range of more than 100 nm and less than 400 nm". Herein, the pore distribution curve of the CNT assembly can be generated from an adsorption isotherm at 77 K of liquid nitrogen based on the BJH method, similarly to the pore distribution curve of the carbon film described above. The peak in the pore distribution curve of a carbon nanotube assembly in a range of more than 100 nm and less than 400 nm means that CNTs in the carbon nanotube assembly are spaced apart from each other with certain spaces, so that the CNTs are not excessively densely aggregated. The upper limit of 400 nm is the measurement limit in the measurement apparatus (BELSORP-mini II) used in Examples.

Herein, from the viewpoint of further increasing the dispersibility as well as further improving the shield performance of the carbon film of the carbon film, the Log differential pore capacity at the highest peak of the pore distribution curve of the CNT assembly is preferably 2.0 cm$^3$/g or more.

<<Condition (3)>>

The condition (3) specifies as follows: "a two-dimensional spatial frequency spectrum of an electron microscopic image of the carbon nanotube assembly has at least one peak within a range of 1 µm$^{-1}$ or more and 100 µm$^{-1}$ or less". A determination whether or not this condition is satisfied can be determined as follows. First, a CNT assembly to be analyzed is observed under an electron microscope (e.g., electrolytic radiation scanning electron microscope) at a magnification (e.g., 10000×), and a plurality of (e.g., 10) electron microscopic images in a field of view of 1 cm square are obtained. Each of the plurality of electron microscopic images obtained is analyzed by fast Fourier transform (FFT) to obtain a two-dimensional spatial frequency spectrum. Each of the obtained two-dimensional spatial frequency spectrum of the plurality of electron microscopic images is binarized, and the average of the peak positions of the highest frequency is calculated. If the average of the obtained peak positions is within the range of 1 µm$^{-1}$ or more 100 µm$^{-1}$ or less, it is determined that the condition (3) was satisfied. Here, "peaks" used in the above determination shall be distinct peaks which are identified by carrying out isolated point detection processing (in other words, a reverse operation of isolated point removal). Accordingly, if no distinct peak is identified within a range of 1 µm$^{-1}$ or more and 100 µm$^{-1}$ or less in isolated point detection processing, it is determined that the condition (3) is not satisfied Herein, from the viewpoint of further increasing the dispersibility as well as further improving the shield performance of the carbon film of the carbon film, the peak of the two-dimensional spatial frequency spectrum is preferably in a range of 2.6 µm$^{-1}$ or more and a range of 100 µm$^{-1}$ or less.

From the viewpoint of further increasing the dispersibility as well as further improving the shield performance of the carbon film of the carbon film, the CNT assembly preferably satisfies at least two of the conditions (1) to (3), and more preferably satisfies all of the conditions (1) to (3).

<<Other Properties>>

In addition to the above conditions (1) to (3), the CNT assembly which can be used for producing the carbon film of the present disclosure preferably has the following properties.

For example, the CNT assembly has a total specific surface area according to the BET method of preferably 600 $m^2/g$ or more, more preferably 800 $m^2/g$ or more, and preferably 2,600 $m^2/g$ or less, more preferably 1,400 $m^2/g$ or less. Further, the CNT assembly which has undergone opening formation treatment preferably has a total specific surface area according to the BET method of 1,300 $m^2/g$ or more. In a CNT assembly having a high specific surface area, the CNTs composing the assembly are spaced apart from each other, so that the CNTs are not excessively bundled. Accordingly, the CNTs are loosely coupled to each other, so that the CNTs can be easily dispersed. The CNT assembly may include single-walled CNTs as the main component, and may also include two-walled CNTs and multi-walled CNTs to the extent that the functionalities are not impaired. The total specific surface area of CNTs according to the BET method can be measured using, for example, a BET specific surface area measurement apparatus according to JIS Z 8830.

The CNTs composing the CNT assembly has an average height of preferably 10 μm or more and 10 cm or less, more preferably 100 μm or more and 2 cm or less. When the average height of the CNTs composing the CNT assembly is 10 μm or more, aggregation with adjacent CNT bundles is prevented, so that the CNTs can be easily dispersed. When the average height of the CNTs composing the CNT assembly is 10 μm or more, a network of the CNTs can be more easily formed, so that the CNTs can be suitably used in applications in which higher conductivity or mechanical strength are required. Further, when the average height of the CNTs composing the CNT assembly is 10 cm or less, rapid generation can be achieved, which reduces adhesion of carbonaceous impurities and improves the specific surface area. Furthermore, when the average height of the CNTs composing the CNT assembly is 2 cm or less, the CNTs become more easily dispersed. The average height of the CNTs can be determined by measuring the lengths of 100 randomly-selected CNTs under observation by scanning electron microscopy (SEM).

The CNT assembly preferably has a tap bulk density of 0.001 $g/cm^3$ or more and 0.2 $g/cm^3$ or less. Because adhesion between CNTs in a CNT assembly having a density in this range is not excessively strong, the CNT assembly has an excellent dispersibility and can be molded into various shapes. When the tap bulk density of the CNT assembly is 0.2 $g/cm^3$ or less, the CNT assembly can be dispersed homogenously in a solvent or the like by agitating because adhesion between CNTs composing the CNT assembly is weaker. Moreover, when the tap bulk density is 0.001 $g/cm^3$ or more, the unity of the CNT assembly improves, making handle of the CNT assembly easier. The tap bulk density is an apparent bulk density when a powdery CNT assembly is filled in a container, and powdery particles are tightly packed with reduced spaces by tapping or vibrating the container or otherwise, so that the powder particles.

Further, the CNTs composing the CNT assembly has an average outer diameter of preferably 0.5 nm or more, more preferably 1.0 nm or more, and preferably 15.0 nm or less, more preferably 10.0 nm or less, and even more preferably 5.0 nm or less. When the average outer diameter the CNTs is 0.5 nm or more, bundling of the CNTs is reduced and a high specific surface area can be maintained. When the average outer diameter the CNTs is 15.0 nm or less, the ratio of multi-walled CNTs is smaller and a high specific surface area can be maintained. The average outer diameter of the CNTs is determined by measuring the diameters (outer diameters) of 100 randomly-selected CNTs under observation by transmission electron microscopy (TEM). The average diameter (Av) and the standard deviation (σ) of the CNTs may be adjusted by changing the production method and the production conditions of the CNTs, or may be adjusted by combining a plurality of types of CNTs obtained by different production methods.

The CNT assembly preferably has a G/D ratio of 1 or more and 50 or less. When the G/D ratio of the CNT assembly is less than 1, it is considered that the crystallinity of single-walled CNTs is low, the amount of contaminants such as amorphous carbon is high, and the content of multi-walled CNTs is high. On the other hand, when the G/D ratio of the CNT assembly is greater than 50, the linearity is increased, the CNTs become more likely to form bundles with smaller spaces, and specific surface areas may be reduced. The G/D ratio is an index commonly used to evaluate the quality of CNTs. In a Raman spectrum of CNTs as measured by a Raman spectrometer, vibration modes referred to as the "G band" (near 1,600 $cm^{-1}$) and "D band" (near 1,350 $cm^{-1}$) are observed. The G band corresponds to vibration modes caused by a hexagonal lattice structure of graphite forming cylindrical surfaces of the CNTs and the D band corresponds to vibration modes caused by amorphous locations. Therefore, as the peak intensity ratio of the G band to the D band (G/D ratio) increases, the CNTs are evaluated to have higher crystallinity (linearity).

The purity of the CNT assembly is preferably as high as possible for achieving a high specific surface area. As used herein, the purity is the carbon purity, and is a value indicating how much percent of the mass of the CNT assembly is composed of carbon. Although there is no upper limit on the purity for achieving a high specific surface area, it is difficult to obtain a CNT assembly of 99.9999 mass % or more for manufacturing reasons. If the purity is less than 95 mass %, a specific surface area of more than 1000 $m^2/g$ is difficult to be achieved without the opening formation treatment. Further, if metal impurities are contained and the carbon purity is less than 95 mass %, the metal impurities react with oxygen in the opening formation treatment to thereby hinder opening of the CNTs, making increase in the specific surface area difficult. From these viewpoints, the purity of the single-walled CNTs is preferably 95 mass % or more.

The certain CNT assembly satisfying at least one of the conditions (1) to (3) described above may have a purity of generally 98 mass % or more, preferably 99.9 mass % or more, without carrying out purification treatment. The CNT assembly hardly has any impurities mixed therein and can sufficiently exhibit the various inherent properties of CNTs. The carbon purity of the CNT assembly can be determined by an elemental analysis using X-ray fluorescence, thermogravimetric analysis (TGA), or other techniques.

<<Method of Producing CNT Assembly>>

There is no particular limitation on the method of producing the CNT assembly, and the production conditions can be adjusted according to desired properties. For example, in production of a CNT assembly satisfying at least one of conditions (1) to (3) described above, the conditions during growth of the CNT assembly should satisfy all of the following (a) to (c).

(a) the growth rate of the CNT assembly is 5 µm/min or more;
(b) the concentration of a catalyst activating material in the growth atmosphere of the CNT assembly is 4 volume % or more; and
(c) during growth of the CNT assembly, an obstacle is present in the growth direction of the CNTs which are to compose the CNT assembly.

The production method satisfying all of (a) to (c) described above enables efficient production of a CNT assembly satisfying at least one of the conditions (1) to (3) described above. The production method is not particularly limited as long as the above-described conditions (a) to (c) are satisfied during growth of the CNT assembly, and a CNT synthesis processes according to any of well-known techniques such as the fluidized bed method, the moving bed method, and the fixed bed method can be employed. As used herein, the fluidized bed method refers to a synthesis method in which CNTs are synthesized while a particulate carrier on which a catalyst for synthesizing CNTs is supported (hereinafter, also referred to as a particulate catalyst carrier) is fluidized. Further, the moving bed method and the fixed bed method refer to synthesis methods for synthesizing CNT without fluidizing a carrier on which a catalyst is supported (particulate carrier or plate-like carrier).

In one example, the production method satisfying all of the above (a) to (c) includes a catalyst carrier formation step of forming a catalyst carrier, a CNT synthesis step of synthesizing CNTs using the catalyst carrier obtained in the catalyst carrier formation step, and a recovery step of recovering the CNTs synthesized in the CNT synthesis step. The catalyst carrier formation step can be carried out according to a well-known wet or dry catalyst supporting method. The recovery step can be carried out using a well-known separation and recovery apparatus such as a classifier.

[CNT Synthesis Step]

The CNT synthesis step is carried out such that all of the above-described conditions (a) to (c) are satisfied during growth of CNTs. Specifically, the condition (a) that "the growth rate of the carbon nanotube assembly is 5 µm/min or more" can be satisfied by appropriately adjusting the concentration, the temperature, and the like of a source gas serving as the carbon source in the CNT growth atmosphere. Herein, the source gas serving as the carbon source is not particularly limited, and gases of hydrocarbons such as methane, ethane, ethylene, propane, butane, pentane, hexane, heptane, propylene, and acetylene; gases of lower alcohols such as methanol and ethanol; and mixtures of these can also be used. Furthermore, the source gas may be diluted with an inert gas. Moreover, from the viewpoint of further increasing the dispersibility of the CNT assembly obtained as well as further improving the shield performance of a carbon film, the growth rate of the CNT assembly is preferably 10 µm/minute or more. The temperature can be adjusted, for example, within a range of 400° C. or higher 1100° C. or lower.

In the CNT growth atmosphere, the source gas serving as the carbon source preferably contains ethylene. Heating ethylene within a certain temperature range (700° C. or higher and 900° C. or lower) can promote a decomposition reaction of ethylene, which leads to fast growth of CNTs when the decomposed gas is brought into contact with the catalyst. However, if the thermal decomposition time is too long, the decomposition reaction of ethylene proceeds excessively, causing deactivation of the catalyst and adhesion of carbon impurities onto the CNT assembly. In production of the CNT assembly of the present disclosure, in an ethylene concentration range of an of 0.1 volume % or more and 40 volume % or less, the thermal decomposition time ranges preferably 0.5 seconds or longer and 10 seconds or shorter. If the thermal decomposition time is shorter than 0.5 seconds, thermal decomposition of ethylene is insufficient, which makes fast growth of a CNT assembly having a large specific surface area difficult. If the thermal decomposition time is longer than 10 seconds, ethylene is decomposed excessively and carbon impurities are generated in a large amount, which causes deactivation of the catalyst and lowered quality of the CNT assembly. The thermal decomposition time is calculated from the following equation:

$$(\text{Thermal decomposition time}) = (\text{volume of heating channel}) / \{(\text{flow rate of source gas}) \times (273.15 + T) / 273.15\}$$

where the volume of the heating channel is the volume of a flow path heated to a predetermined temperature $T$ ° C., through which the source gas is made to flow before the source gas is brought into contact with the catalyst, and the source gas flow rate is a flow rate at 0° C. under 1 atm.

Further, the condition (b) that "the concentration of a catalyst activating material in the growth atmosphere of the carbon nanotube assembly is 4 volume % or more" can be satisfied by appropriately adjusting the feeding rate of the catalyst activating material fed during the CNT growth. From the viewpoint of further increasing the dispersibility of the CNT assembly obtained as well as further improving the shield performance of a carbon film, the concentration of a catalyst activating material in the growth atmosphere of the CNT assembly is preferably 5 volume % or more. The catalyst activating material is not particularly limited, and examples thereof include water, oxygen, ozone, acidic gases, and nitrogen oxide; oxygen-containing compounds having a low carbon number, such as carbon monoxide and carbon dioxide; alcohols such as ethanol and methanol; ethers such as tetrahydrofuran; ketones such as acetone; aldehydes; esters; and mixtures thereof. Of these, carbon dioxide is preferred. Note that a material containing both carbon and oxygen, such as carbon monoxide and alcohols, may serve as both a source gas and a catalyst activating material. For example, carbon monoxide severs as a catalyst activating material when combined with a more reactive source gas such as ethylene, and severs as a source gas when combined with a catalyst activating material which has a stronger catalyst activating action even in a trace amount such as water.

Furthermore, the condition (c) that "during synthesis of the carbon nanotube assembly, an obstacle is present in the growth direction of the carbon nanotubes which are to compose the carbon nanotube assembly" can be satisfied by selecting the fluidized bed method in the CNT synthesis step or adjusting the interval to dispose the catalyst carrier in the moving bed method or the fixed bed method.

Herein, upon synthesis of CNTs by the above-described fluidized bed method, for example, the CNT synthesis step may be performed by feeding a raw material gas while feeding a gas from below to fluidize the particulate catalyst carrier, or by feeding a raw material gas while continuously conveying the particulate catalyst carrier by rotations of a screw.

The catalyst carrier has a carrier and a catalyst supported on the surface of the carrier. The carrier is the portion forming a matrix structure such that the catalyst is adhered to, fixed to, formed as a film on, or formed on the surface of the carrier for supporting the catalyst. The carrier may be structured only from the carrier, or a carrier may be provided with an optional under layer for satisfactorily supporting the catalyst on the surface of the carrier. The carrier is preferably particulate, and the particle size thereof in terms of volume average particle size is preferably 1 mm or less, more preferably 0.7 mm or less, and even more preferably 0.4 mm or less, and is preferably 0.05 mm or more. When the particle size is equal to or smaller than the any of above upper limits, the CNT bundle to be grown becomes thinner, which is advantageous to form a wave-like structure. The particle density in terms of apparent volume is preferably 3.8 g/cm$^3$ or more, more preferably 5.8 g/cm$^3$ or more, and is preferably 8 g/cm$^3$ or less. When the particle density is equal to or higher than any of the above lower limits, the force applied to the CNT bundle during growth is increased, which is advantageous to form a wave-like structure. The material of the carrier is preferably a metal oxide containing one or more elements of Al and Zr. Of these, zirconia beads containing Zr with a high elemental amount are particularly preferred.

Herein, in the case where a particulate carrier is used, an example of the method of making the catalyst to be supported on the surface of the particulate carrier is, for example, a method of using a rotary drum coating apparatus having a substantially cylindrical rotary drum. In the case where a base layer is disposed on the surface of a particulate carrier and the catalyst is then made to be supported, a solution containing a component which can be used to form the base layer is sprayed and dried on the surface of the particulate carrier and dried to thereby dispose the base layer on the surface of the carrier, prior to spraying and drying the catalyst solution. This method enables the catalyst layer and/or the base layer to be formed in a relatively simpler manner without any unevenness.

In the CNT synthesis step, before the "growth step" is carried out so that the above-described conditions (a) to (c) are satisfied, a "formation step" of reducing the catalyst supported on the catalyst carrier may be carried out. Moreover, after the growth step is terminated, a "cooling step" of cooling the catalyst carrier on which the CNT has grown may be carried out. In the "formation step", for example, at least one of a reducing gas atmosphere which is an atmosphere including the catalyst carrier or the catalyst carrier is heated to reduce and microparticulate the catalyst supported on a catalyst carrier. The temperature of the catalyst carrier or the reducing gas atmosphere in the formation step is preferably 400° C. or higher and 1100° C. or lower. The time to carry out the formation step may be 3 minutes or longer and 120 minutes or shorter. Note that the reducing gas may, for example, be hydrogen gas, ammonia gas, water vapor, or a gas that is a mixture thereof. Furthermore, the reducing gas may be a mixed gas obtained by mixing these gases with an inert gas such as helium gas, argon gas, or nitrogen gas.

On the other hand, in the "cooling step", the catalyst carrier on which the CNTs have grown is cooled in an inert gas environment. In this step, an inert gas similar to the inert gas which can be used in the growth step may be used as the inert gas. Further, in the cooling step, the temperature of the catalyst carrier on which the CNT has grown is lowered to a temperature of preferably 400° C. or lower, more preferably 200° C. or lower.

<Dry Pulverization>

For producing the carbon film of the present disclosure, dry pulverization can be carried out on the CNT assembly, where necessary, before the film formation.

Note that "dry pulverization" in the present disclosure refers to pulverization in a state where the target to be pulverized substantially does not contain any solvent (e.g., a state where the solid concentration is 95% or more).

A pulverization apparatus that can be used in the dry pulverization is not particularly limited as long as it is an apparatus that can apply a physical load to an assembly composed of fine structures by agitation or the like. An example of such an apparatus which can be used is a mixer having a rotating blade.

The pulverization conditions are also not particularly limited. For example, when a mixer having a rotating blade is used as the pulverization apparatus, the rotation speed is preferably 500 rpm or more and 5000 rpm or less, and the pulverizing time is preferably 10 seconds or longer and 20 minutes or shorter.

<Film Formation>

The CNT assembly which has optionally been subjected to the above-described dry pulverization is formed into a film, whereby the carbon film of the present disclosure can be produced.

Herein, the method of forming the CNT assembly into a film is not particularly limited, but a method of preparing a CNT dispersion liquid by dispersing the CNT assembly in a dispersion medium such as water and removing at least a part of the dispersion medium from the CNT dispersion liquid is preferred.

Although there is no particular limitation on the method of preparing the CNT dispersion liquid, the CNT dispersion liquid can be obtained by dispersing the CNT assembly which has been subjected to the above-described dry pulverization, where necessary, into a dispersion medium by a well-known method.

Examples of the method of removing the dispersion medium from the CNT dispersion liquid include well-known methods such as filtration and drying.

The filtration method is not particularly limited, and well-known filtration methods such as natural filtration, reduced-pressure filtration (suction filtration), pressurized filtration, and centrifugal filtration can be used.

Examples of drying methods that can be used include known drying methods such as hot-air drying, vacuum drying, hot-roll drying, and infrared irradiation. Although no specific limitations are placed on the drying temperature and time, the drying temperature is generally from room temperature to 200° C. and the drying time is generally 1 hour or longer and 48 hours or shorter. Without limitation, the drying may be carried out on a well-known substrate.

Of these, upon removal of the dispersion medium, at least drying is preferably carried out.

Note that the filtration and drying may be used in combination. For example, a film-shaped filtrate (primary sheet) obtained by filtrating the CNT dispersion liquid can be further dried to obtain a carbon film of the present disclosure.

(Properties of Carbon Film)

Herein, the carbon film of the present disclosure has a thickness of preferably 5 μm or more, and preferably 150 μm or less, more preferably 100 μm or less. When the thickness is 5 μm or more, the carbon film can have sufficient mechanical strength and can provide further excellent shield performance. On the other hand, when the thickness is 150 μm or less, the weight of the carbon film can be reduced.

Note that the "thickness" of the carbon film can be measured by the method described in the EXAMPLES section.

Further, the carbon film of the present disclosure is preferably a free-standing film. The carbon film which is a free-standing film is excellent in handleability, and when the carbon film is used as an electromagnetic wave shield sheet, for example, the degree of freedom of the arrangement of the sheet can be increased.

EXAMPLES

The following provides more specific description of the present disclosure with reference to examples. However, the present disclosure is not limited to these examples.

In Examples and Comparative Example, measurements and evaluations were carried out as follows.

<Fourier Transform Infrared Spectroscopic Analysis (FT-IR)>

To 10 mg of each CNT assembly (CNT assembly in Example 1 and SGCNTs), 100 g of water containing sodium dodecylbenzenesulfonate as a surfactant at a concentration of 1 mass % was added. The resultant was agitated in an ultrasonic bath at 45 Hz for 1 minute to obtain 100 ml of a dispersion liquid of each CNT assembly.

Each dispersion liquid prepared as described above was two-fold diluted with a solvent having the same composition, which was dropped onto a silicon substrate and dried. Thereafter, a measurement of the effective plasmon length was carried out based on a plasmon far-infrared (FIR) resonance peak using a Fourier transform infrared spectrophotometer. The effective plasmon lengths are summarized in Table 1. The FIR resonance chart of the obtained FIR spectra is depicted in FIG. 3. The curves plotted in FIG. 3 are the CNT assembly used in Example 1 and the SGCNTs in this order from the top. As indicated in the chart, the curve corresponding to the CNT assembly used in Example 1 had the optical density peak at greater than 300 $cm^{-1}$. On the other hand, the optical density peak in the curve corresponding to the SGCNTs was located at 214 $cm^{-1}$. Note that the position of each plasmon peak top was determined based on the approximation curve by polynomial fitting using drawing software.

<Measurement of Bundle Length of CNTs>

Using each dispersion liquid prepared for the FT-IR measurements, the average ISO area diameter of CNT dispersions present in the dispersion liquid was measured using a circulation-type image analysis particle size distribution meter "CF-3000", manufactured by JASCO International Co., Ltd.), and the obtained value was used as the CNT bundle length. The conditions for the analysis were as follows.

<Conditions for Analysis>

Injection volume: 50 ml (sampling volume: 1.2%)
Flow cell spacer: 1000 μm
Front lens magnification: 2×
Telecentric lens magnification: 0.75×
Length per pixel: 2.3 μm per pixel While each dispersion liquid was circulated, measurements were made 4 times under the same conditions, and the arithmetic mean value of measured values was obtained.

<Generation of Pore Distribution Curve (CNT Assembly)>

Figure 4:
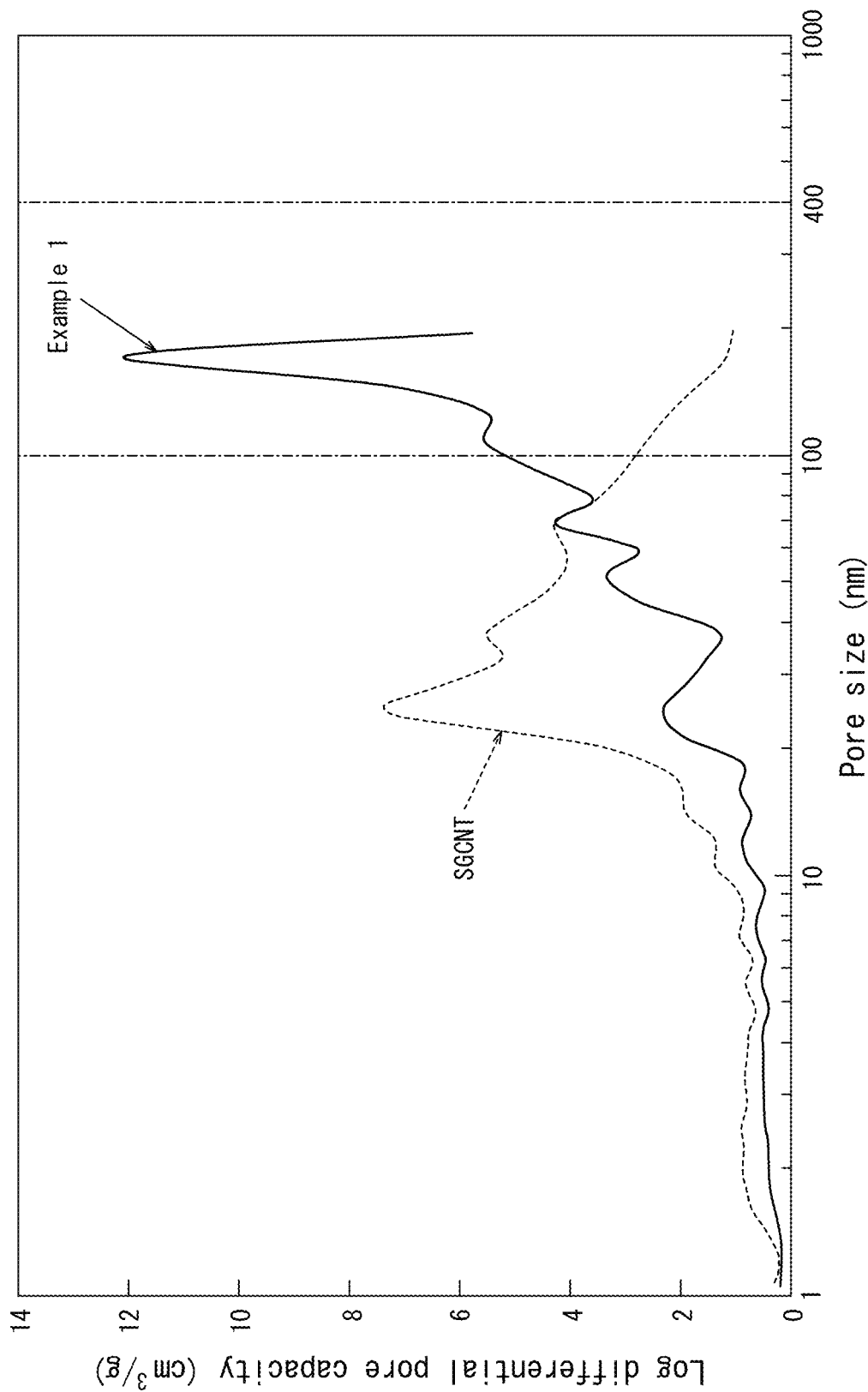
FIG. 4 depicts one example of a pore distribution curve of a CNT assembly.

Using 10 mg or more of each CNT assembly (CNT assembly in Example 1 and SGCNTs), the adsorption and desorption isotherm was obtained using liquid nitrogen at 77 K using BELSORP-mini II (manufactured by MicrotracBEL Corp.) (the adsorption equilibration time was set to 500 seconds). The CNT assembly was pretreated by degassing under vacuum at 100° C. for 12 hours. The pore distribution curve of each sample was obtained from the adsorption amount on the adsorption isotherm by the BJH method. The results are depicted in FIG. 4. As depicted in FIG. 4, the highest peaks of the differential pore capacity were identified in pore size regions of 100 nm or more in the CNT assembly used in Example 1. In contrast, the highest peak was identified in a pore size region of less than 100 nm in the SGCNTs.

Upon generation of the pore distribution curve of the CNT assembly, the range to measure the pore size was set to 1 nm or more and less than 400 nm.

<Generation of Pore Distribution Curve (Carbon Film)>

A test piece of 10 mg or more was cut out from each carbon film in Examples 1 and 2 and Comparative Example 1, and the adsorption and desorption isotherm was obtained using liquid nitrogen at 77 K using BELSORP-mini II (manufactured by MicrotracBEL Corp.) (the adsorption equilibration time was set to 500 seconds). The carbon film was pretreated by degassing under vacuum at 100° C. for 12 hours. The pore distribution curve of each sample was obtained from the adsorption amount on the adsorption isotherm by the BJH method. The results are depicted in FIG. 1. As depicted in FIG. 1, the highest peaks of the differential pore capacity were identified in pore size regions of 10 nm or more and 100 nm or less in Examples 1 and 2. In contrast, the highest peak was identified in a pore size region of less than 10 nm in Comparative Example 1.

Upon generation of the pore distribution curve of the carbon film, the range to measure the pore size was set to 1 nm or more and less than 400 nm.

(Two-Dimensional Spatial Frequency Spectrum Analysis of Electron Microscopic Image)

Figure 5A:
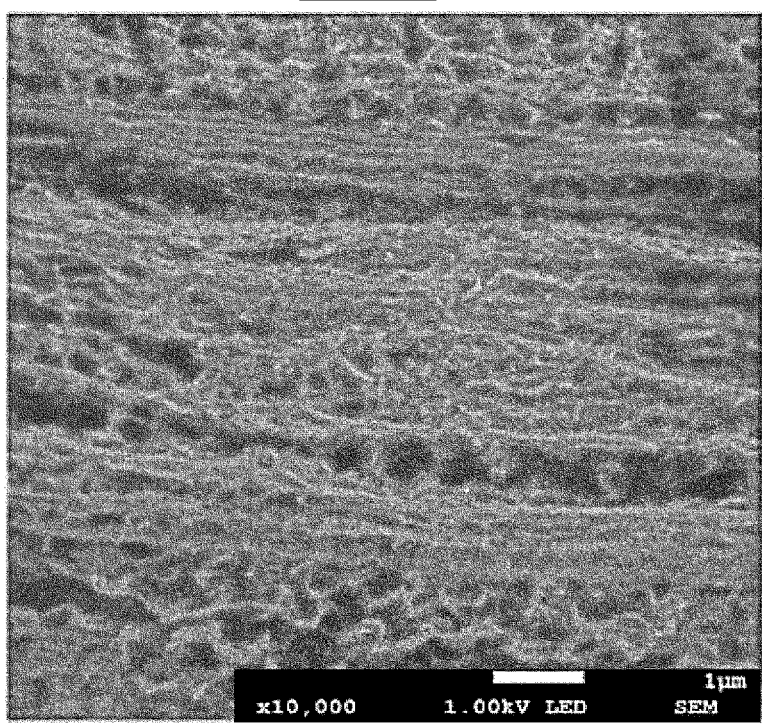
FIG. 5A depicts one example of an SEM image of a CNT assembly used in Example 1.
Figure 5B:
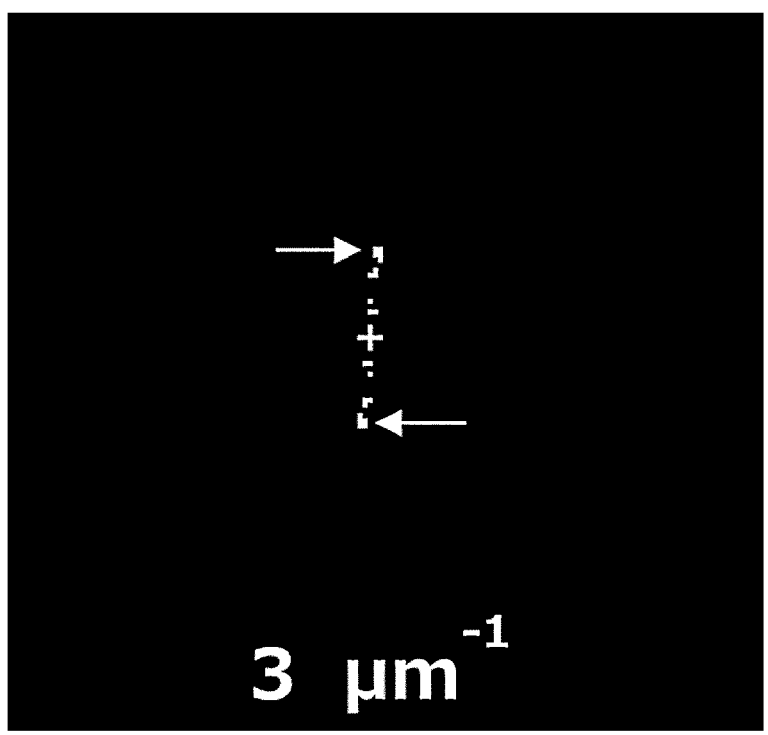
FIG. 5B is a two-dimensional spatial frequency spectrum obtained on the image of FIG. 5A.
Figure 6A:
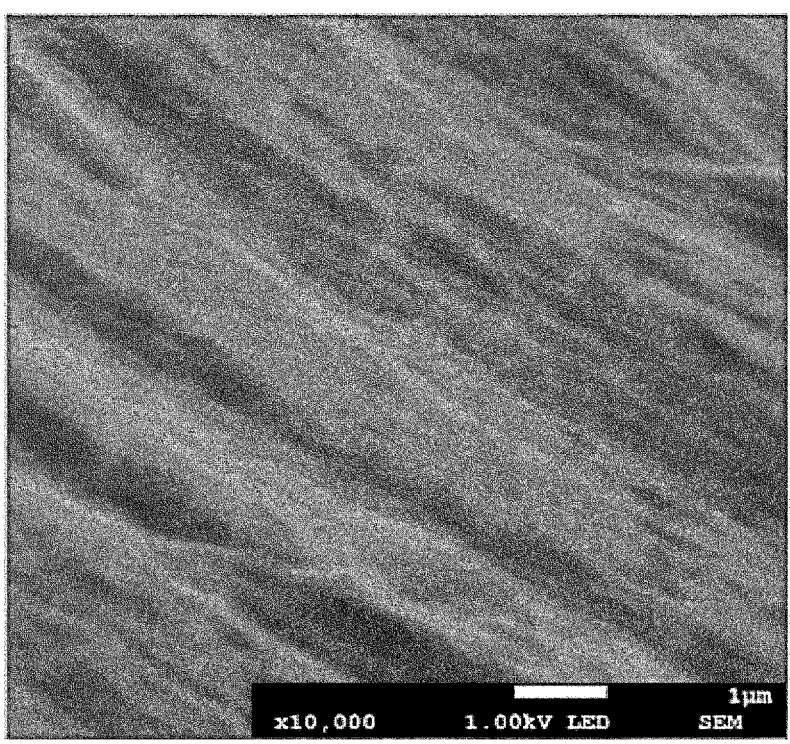
FIG. 6A depicts one example of an SEM image of SGCNTs.
Figure 6B:
FIG. 6B is a two-dimensional spatial frequency spectrum obtained on the image of FIG. 6A.

On a carbon tape, 0.01 mg of each CNT assembly (CNT assembly in Example 1 and SGCNTs) was placed, and excess CNTs were removed by blowing to prepare a sample. The sample was observed at 10,000× under a field emission scanning electron microscope, and 10 photographs were taken in a field of view of 1 cm square, which was arbitrarily selected. Fast Fourier transform processing was carried out on each of the 10 electron microscopic images to obtain a two-dimensional spatial frequency spectrum. The obtained two-dimensional spatial frequency spectra were binarized, and the outermost peak positions (on the high frequency side) were identified and the average was calculated. In the binarization, when the numerical value obtained through the fast Fourier transform processing was greater than 0.75, 1 was given, or 0 was given otherwise. FIG. 5A is one of the 10 images obtained in Example 1, and FIG. 5B is a two-dimensional spatial frequency spectrum obtained from this image. In FIG. 5B, the components closer to the center are low-frequency components, and the components located outward from the center correspond to higher-frequency components. In the diagram, the arrows indicate the peak positions (3 $\mu m^{-1}$) with the greatest wave number among the distinct peaks detected in the region of 1 to 100 $\mu m^{-1}$. Similarly, FIG. 6A is one of electron microscopic images obtained with the SGCNTs, and FIG. 6B is a two-dimensional spatial frequency spectrum obtained from this image. In an attempt to detect a distinct peak, isolated point extracting processing was carried out on all the images obtained with the SGCNTs including the data depicted in FIGS. 6A and 6B, but no distinct peak was identified in the region of 1 to 100 $\mu m^{-1}$. Thus, the SGCNTs was confirmed not to satisfy the above-described condition (3).

<Thickness>

The thickness of each carbon film was measured using "Digimatic Standard Outer Micrometer" manufactured by Mitutoyo Corporation.

<Shield Performance>

The reflection coefficient S11 and the transmission coefficient S21 of each carbon film were measured by the microstrip line method in accordance with IEC-62333-2, and the transmission attenuation power ratio Rtp was calculated. The details of the measurement apparatuses used and the measurement frequency were as follows.

Network analyzer: "Vector Network Analyzer 37 169A", manufactured by ANRITSU CORPORATION Measurement apparatuses: "TF-3B" (0.1 to 3 GHz) manufactured by KEYCOM Corp., and "TF-18C" (2.0 GHz to 18 GHz), manufactured by KEYCOM Corp.

Then, the transmission attenuation power ratios Rtp at measurement frequencies of 2.5 GHz, 4.5 GHz, and 7.5 GHz were evaluated by the following criteria. A higher transmission attenuation power ratio at a frequency indicates a better shield performance of the carbon film at that frequency.

A: the transmission attenuation power ratio was 20 dB or more; and

B: the transmission attenuation power ratio was less than 20 dB.

Example 1

<Preparation of CNT Assembly>

Figure 7:
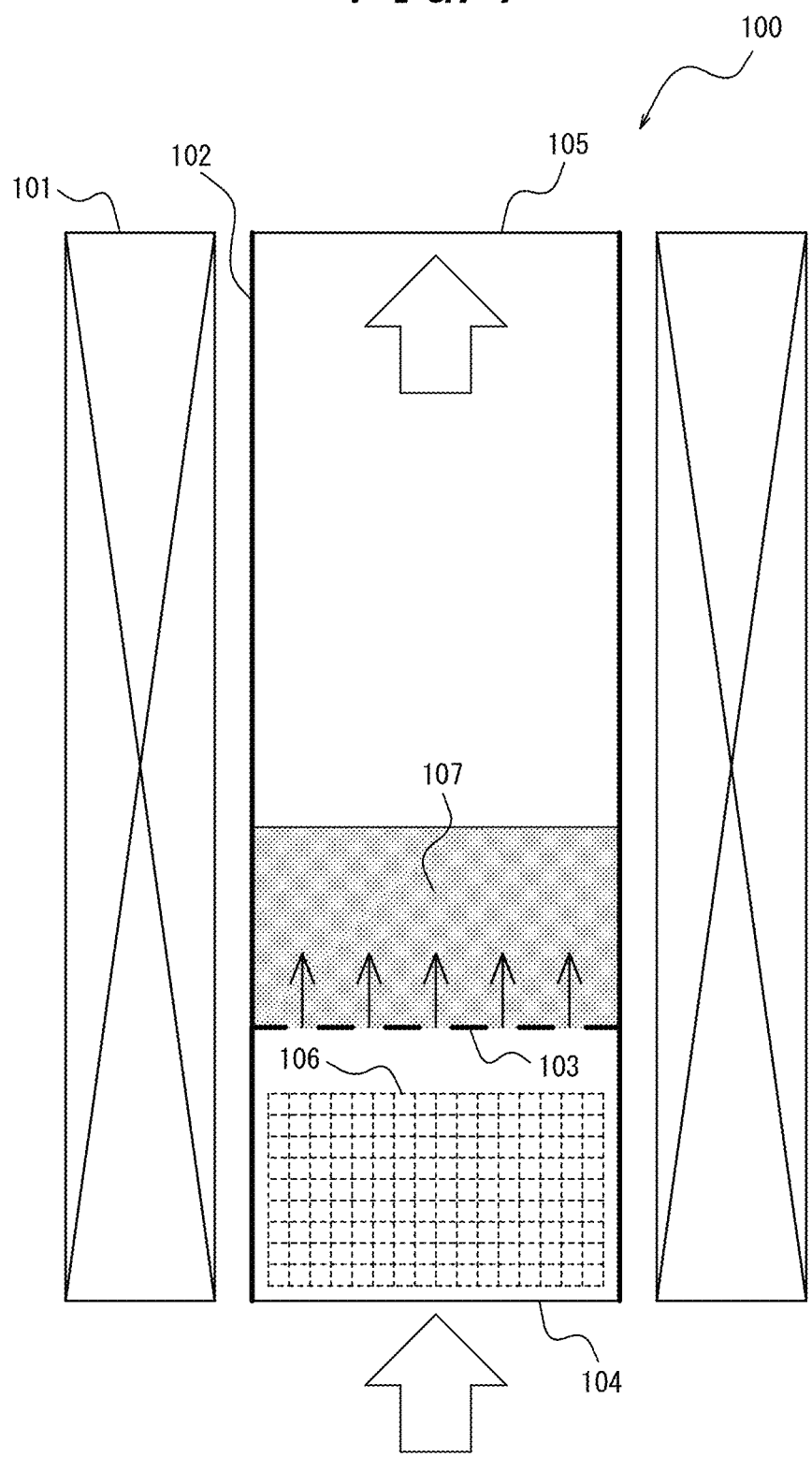
FIG. 7 is a schematic configuration of a CNT manufacturing apparatus.

In this example, CNTs were synthesized using the fluidized bed method in the CNT synthesis step. The schematic configuration of a CNT manufacturing apparatus used is depicted in FIG. 7. The CNT manufacturing apparatus 100 depicted in FIG. 7 includes a heater 101, a reaction tube 102, a dispersion plate 103, a reducing gas/source gas inlet 104, an exhaust vent 105, and a gas heating promoting unit 106. The material of the reaction tube 102 and the dispersion plate 103 was synthetic quartz.

<<Catalyst Carrier Formation Step>>

A catalyst carrier formation step will be described below. Zirconia (zirconium dioxide) beads ($ZrO_2$, volume average particle size D50: 350 µm) as a carrier were charged into a rotary drum type coating apparatus. While the zirconia beads were agitated (20 rpm), a solution containing aluminum was sprayed (spray amount: 3 g/min, spray time: 940 seconds, spray air pressure: 10 MPa) by a spray gun. At the same time, compressed air (300 L/minute) was fed to the rotary drum for drying to form an aluminum-containing film on the zirconia beads. Next, a firing treatment was performed at 480° C. for 45 minutes to prepare primary catalyst particles having an aluminum oxide layer formed thereon. Thereafter, the resultant primary catalyst particles were charged into another rotary drum type coating apparatus. While agitating (at 20 rpm), compressed air (300 L/minute) was fed into the rotary drum. An iron catalyst solution was sprayed with a spray gun (spray amount: 2 g/min, spray time: 480 seconds, spray air pressure: 5 MPa) to form a coating film containing iron on the primary catalyst particles. Next, a firing treatment was performed at 220° C. for 20 minutes to prepare a catalyst carrier having an iron oxide layer further formed thereon.

<<CNT Synthesis Step>>

The reaction tube 102 of the CNT manufacturing apparatus 100 was charged with 300 g of the thus-prepared catalyst carrier. While the catalyst carrier 107 was fluidized by flowing the gases, the formation step, the growth step, and the cooling step were carried out in this order to thereby produce a CNT assembly. The conditions for each step included in the CNT synthesis process were set as follows.

[Formation Step]

Setting temperature: 800° C.

Reducing gases: 3 sLm of nitrogen and 22 sLm of hydrogen

Process time: 25 minutes

[Growth Step]

Reaction temperature: 800° C.

Source gases: 15 sLm of nitrogen, 5 sLm of ethylene, 2 sLm of carbon dioxide, and 3 sLm of hydrogen Process time: 10 minutes Thermal decomposition time of source gases: 0.65 seconds

[Cooling Step]

Cooling temperature: room temperature

Purge gas: 25 sLm of nitrogen

The CNT assembly synthesized on the catalyst carrier was separated and recovered using a forced vortex classifier (revolution speed: 3500 rpm, air flow rate: 3.5 $Nm^3$/minute). The recovery rate of the CNT assembly was 99%.

The properties of the CNT assembly produced in this example were as follows: tap bulk density: 0.01 $g/cm^3$, average height of CNTs: 200 µm, BET specific surface area: 800 $m^2/g$, average outer diameter: 4.0 nm, and carbon purity: 99%.

<Production of Carbon Film>

To 1 g of the CNT assembly obtained as described above, 1000 g of water was added. The mixture was stirred for 5 minutes at a rotation speed of 3000 rpm with an ultra-high speed emulsification and dispersion apparatus (trade name: "LABOLUTION®" (LABOLUTION is registered trademark in Japan, other countries, or both), available from THINKY CORPORATION) to obtain a CNT dispersion liquid.

The resulting CNT dispersion liquid was applied onto a substrate. The coating film on the substrate was vacuum dried at a temperature of 80° C. for 24 hours to thereby form a carbon film on the substrate. Thereafter, the carbon film was peeled off from the substrate to obtain a carbon film (free-standing film) having a thickness of 100 µm. The shield performance of the obtained carbon film was evaluated. The results are summarized in Table 1.

Example 2

<Preparation of CNT Assembly>

SGCNTs (trade name: "SG101", manufactured by Zeon Corporation) were used as a CNT-assembly.

<Dry Pulverization>

The above-mentioned SGCNTs were subjected to dry pulverization. The dry pulverization was performed at a rotation speed of 1000 rpm for 6 minutes using a mixer equipped with a rotating blade (trade name "Magic BULLET", model number MGTXH-AM, available from Shop Japan Co., Ltd.).

<Production of Carbon Film>

A carbon film (free-standing film) having a thickness of 100 µm was obtained in the same manner as in Example 1, except that the dry-pulverized SGCNTs described above was used. The shield performance of the obtained carbon film was evaluated. The results are summarized in Table 1.

Comparative Example 1

A carbon film (free-standing film) having a thickness of 100 µm was obtained in the same manner as in Example 2, except that the dry pulverization was not performed. The shield performance of the obtained carbon film was evaluated. The results are summarized in Table 1.

TABLE 1

|  |  |  | Example 1 | Example 2 | Comp. Example 1 |
|---|---|---|---|---|---|
| CNT assembly | Condition (1) | FIR resonance peak ($cm^{-1}$) | 830 | 242 | 242 |
|  |  | Effective plasmon length (nm) | 57 | 195 | 195 |
|  |  | ISO area diameter of dispersion (μm) | 238 | 636 | 636 |
|  | Condition (2) | Presence or absence of largest peak within pore size range of 100 to 400 nm | Present | Absent | Absent |
|  | Condition (3) | Peak position ($μm^{-1}$) in spatial frequency spectrum in 1 to 100 $μm^{-1}$ and presence or absence of peak | Present (3) | Absent | Absent |
| Dry pulverization |  |  | No | Yes | No |
| Carbon film | Pore distribution curve | Position of highest peak (nm) | 24 | 28 | 2 |
|  |  | Value of Log differential pore capacity ($cm^3/g$) at highest peak | 3.5 | 2.3 | 1.1 |
| Evaluation | Shield performance | 2.5 GHz | A | A | B |
|  |  | 4.5 GHz | A | A | B |
|  |  | 7.5 GHz | A | A | B |

It can be seen from Table 1 that the carbon films of Examples 1 to 2 having peaks in which the Log differential pore capacity was maximized within a pore size range of 10 nm or more and 100 nm or less and having a Log differential pore capacity at the peak of 1.2 $cm^3/g$ or more can have an excellent shield performance in a wide frequency range.

INDUSTRIAL APPLICABILITY

According to the present disclosure, a carbon film having an excellent shield performance against electromagnetic waves can be provided.

REFERENCE SIGNS LIST

100 CNT manufacturing apparatus
101 Heater
102 Reaction tube
103 Dispersion plate
104 Reducing gas/raw gas inlet
105 Exhaust vent
106 Gas heating promotion section
107 Catalyst carrier

The invention claimed is:

1. A carbon film formed from a carbon nanotube assembly,
   a pore distribution curve of the carbon film indicating a relationship between a pore size and a Log differential pore capacity obtained from an adsorption isotherm at 77 K of liquid nitrogen based on the Barrett-Joyner-Halenda method having a peak in which the Log differential pore capacity is maximized within a pore size range of 10 nm or more and 100 nm or less, and
   a value of the Log differential pore capacity at the peak being 1.2 $cm^3/g$ or more.

2. The carbon film according to claim 1, being a free-standing film.

3. The carbon film according to claim 1, having a thickness of 5 μm or more and 150 μm or less.

4. The carbon film according to claim 1, being an electromagnetic wave shield sheet.

* * * * *